United States Patent [19]

Heller et al.

[11] Patent Number: 5,621,290
[45] Date of Patent: Apr. 15, 1997

[54] MOVABLE-WINDOW SAFETY DEVICE

[75] Inventors: Norbert Heller, Grefrath; Klaus Hanndorf, Krefeld; Alfons Stockschlager, Viersen, all of Germany

[73] Assignee: Draftex Industries Limited, Edinburgh, Scotland

[21] Appl. No.: 690,230

[22] Filed: Jul. 19, 1996

Related U.S. Application Data

[63] Continuation of Ser. No. 324,777, Oct. 17, 1994.

[30] Foreign Application Priority Data

| Oct. 18, 1993 | [GB] | United Kingdom | 9321484 |
| Oct. 27, 1993 | [GB] | United Kingdom | 9322165 |
| Dec. 9, 1993 | [GB] | United Kingdom | 9325242 |
| Dec. 24, 1993 | [GB] | United Kingdom | 9326467 |
| Jan. 11, 1994 | [GB] | United Kingdom | 9400407 |

[51] Int. Cl.⁶ .................................................. G01R 27/26
[52] U.S. Cl. .................... 318/466; 318/479; 361/181; 324/686; 307/10.1; 307/129; 49/26; 49/28
[58] Field of Search ................................. 318/280, 286, 318/445, 449, 450, 466–469, 478, 479, 264–267; 307/9.1, 10.1, 116, 125, 129; 180/271–272, 279, 281; 49/26–28; 324/658, 676–682, 686, 687, 690; 340/657, 658; 361/179, 181

[56] References Cited

U.S. PATENT DOCUMENTS

| 3,651,389 | 3/1972 | Ito et al. | 318/266 |
| 4,351,016 | 9/1982 | Felbinger | 361/181 |
| 4,410,843 | 10/1983 | Sauer et al. | 318/466 X |
| 4,453,112 | 6/1984 | Sauer et al. | 318/281 |
| 4,458,445 | 7/1984 | Sauer et al. | 49/26 |
| 4,652,864 | 3/1987 | Calvin | 340/553 |
| 4,672,230 | 6/1987 | Spahn | 307/116 |
| 4,716,605 | 1/1988 | Shepherd et al. | 4/544 |
| 4,732,238 | 3/1988 | Baumgartner . | |
| 4,753,323 | 6/1988 | Kahkipuro . | |
| 4,760,490 | 7/1988 | Murao | 361/181 |
| 4,796,013 | 1/1989 | Yasuda et al. | 340/562 |
| 5,081,406 | 1/1992 | Hughes et al. | 318/478 |
| 5,159,247 | 10/1992 | Resch | 318/483 |
| 5,164,709 | 11/1992 | Lamberty et al. | 340/667 |
| 5,189,377 | 2/1993 | Rhoades | 324/662 |
| 5,285,136 | 2/1994 | Duhame | 318/266 |
| 5,463,378 | 10/1995 | Gibb | 340/618 |
| 5,469,364 | 11/1995 | Hughey et al. | 324/482 |
| 5,512,836 | 4/1996 | Chen et al. | 324/687 |
| 5,525,843 | 6/1996 | Howing | 307/9.1 |

FOREIGN PATENT DOCUMENTS

| 0062568 | 3/1982 | European Pat. Off. . |
| 0377226 | 12/1989 | European Pat. Off. . |
| 3418589 | 11/1985 | Germany . |
| 3521004 | 12/1986 | Germany . |
| 3527405 | 2/1987 | Germany . |
| 3736400 | 6/1989 | Germany . |
| 4036465 | 5/1991 | Germany . |
| 2250822 | 6/1992 | United Kingdom . |

*Primary Examiner*—Brian Sircus
*Attorney, Agent, or Firm*—Leydig, Voit & Mayer, Ltd.

[57] ABSTRACT

A window glass in a motor vehicle body is slidable in a vertical direction within a window frame by means of an electric motor controlled by "up" and "down" switches. The window glass slides with reference to a window guide channel. The window guide channel incorporates a metal carrier or other electrical conductor which receives the output from electrical oscillating means. If a human hand, or other part of the human body, is present within the frame of the window, when the window is open, and within a predetermined distance from the window guide channel, the resultant capacitive effect will change the output of the oscillator. This output change is detected by a detecting unit and opens a switch. This switch is connected in series with the "up" switch for the window drive motor and thus either stops the motor, if it is driving the window glass upwards, or prevents the window glass from being so driven.

25 Claims, 10 Drawing Sheets

MOVABLE-WINDOW SAFETY DEVICE

RELATED APPLICATION

This application is a Continuation of application Ser. No. 08/324,777 filed Oct. 17, 1994.

BACKGROUND OF THE INVENTION

The invention relates to a system for controlling a power-driven window movable in a window opening between closed and open positions.

One such system is shown, for example, in French patent specification No. 2,098,871. In this system, for controlling a power-driven window in a motor vehicle, an electrical conductor is incorporated into insulating material and mounted on or around the frame of the window. The conductor is connected to the non-grounded terminal of the vehicle's electrical battery so as to produce a difference in potential between that conductor and the remainder of the vehicle's body. An electrical capacitor is thus produced such that the entry of a part of the human body into the window opening alters the dielectric of the capacitor. This may be detected by a Wheatstone bridge circuit and stops the movement of the window glass.

An object of the invention, however, is to produce a system with greater sensitivity to the detection of the presence of a part of the human body (or other object), but also with the possibility of being less sensitive to the effects of ambient conditions.

Another system for controlling a power-driven window glass slidable in a window frame is known from German patent specification No. 3,724,085. This system comprises electrically conductive means adapted to be mounted in use adjacent to the window opening so as to be physically moved by direct or indirect contact with part of the human body positioned between the moving window glass and its frame during power-driven closure of the window. This system requires electrical contact to be made between two conductors. Such contact interrupts power-driven movement of the window glass.

Another object of the invention, therefore, is to produce a system which is not affected by ageing and similar effects which may alter the force necessary to achieve the necessary contact in such a system between the conductors.

BRIEF SUMMARY OF THE INVENTION

According to the invention, there is provided a system for controlling a power-driven window movable in a window opening between closed and open positions, comprising: electrical circuit means for producing an electrical output, electrically conductive means adapted to be positioned adjacent to the window opening, connecting means connecting the conductive means to the electrical circuit means such that the presence of a part of the human body at or not more than a predetermined distance from the conductive means produces a change in the electrical output, detecting means responsive to the change in the electrical output to produce an output signal, and output means responsive to the output signal for interrupting movement of the window glass in the window opening, the electrical circuit means producing the electrical output as an electrically oscillating output.

According to the invention, there is further provided a system for controlling a power-driven window glass slidable in a window frame, comprising: electrically conductive means adapted to be mounted in use adjacent to the window opening so as to be physically moved by direct or indirect contact with part of the human body positioned between the moving window glass and its frame during power-driven closure of the window, electrical circuit means connected to the electrically conductive means so as to respond to the said movement of the electrically conducted means and to produce a corresponding output, detecting means responsive to the output to produce a control signal, and control means responsive to the control signal for interrupting power-driven movement of the window glass, the electrical circuit means incorporating an electrical oscillator, and in that the electrically conductive means being connected in a tuned circuit of the oscillator whereby the said movement of the electrically conductive means changes the frequency of the oscillator to produce the said output.

DESCRIPTION OF THE DRAWINGS

Safety systems for interrupting the movement of a power-driven window in a motor vehicle, to prevent human injury, will now be described, by way of example only, with reference to the accompanying diagrammatic drawings in which.

DESCRIPTION OF PREFERRED EMBODIMENTS

Figure 1:
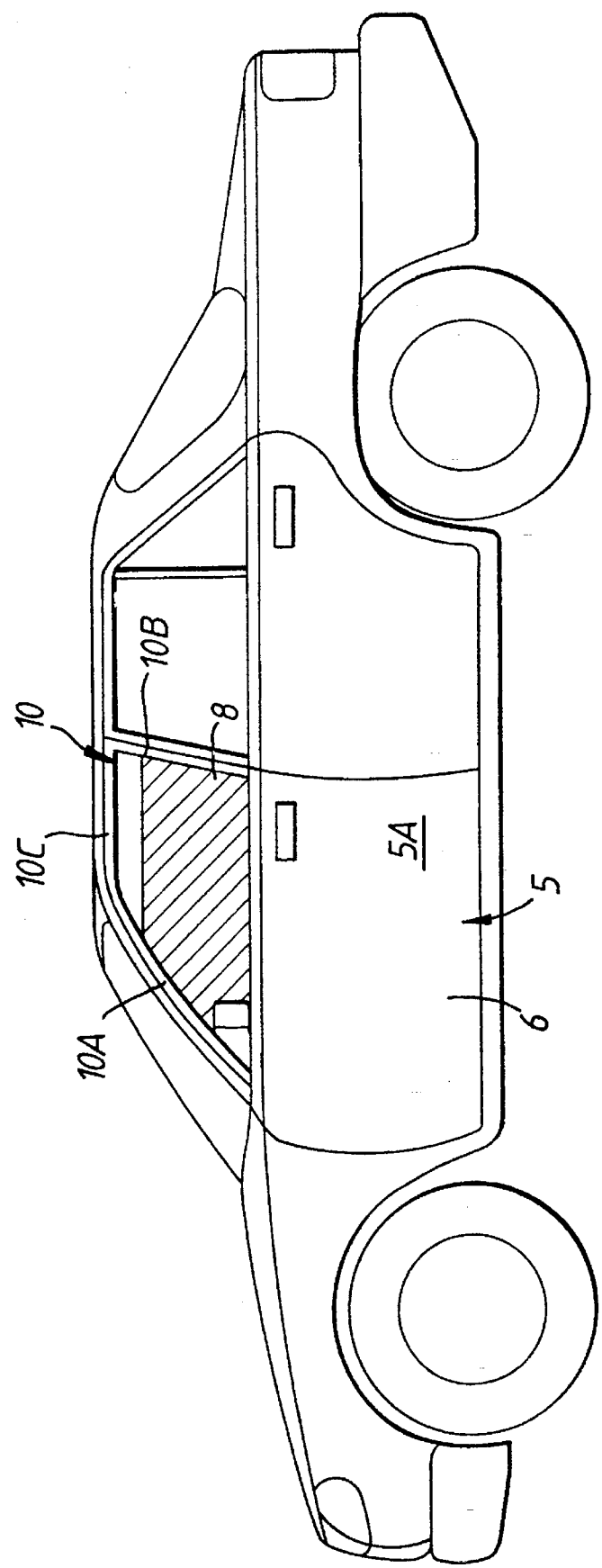
FIG. 1 is a diagrammatic side elevation of a motor vehicle.

FIG. 1 shows a motor vehicle 5 having a front door 6 with a power-driven window 8 which is shown cross-hatched for clarity. The power-driven window 8 is raised and lowered by means of a suitable motor, normally an electric motor, under the control of switches positioned within the vehicle for use by the driver or passenger. All or some of the other side windows in the vehicle may also be power-driven.

Figure 2:
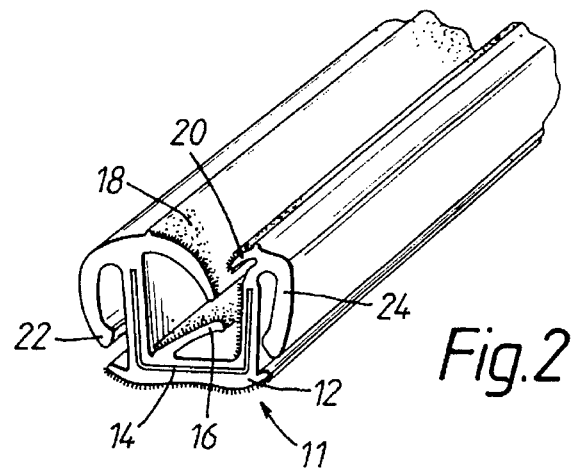
FIG. 2 is a perspective elevation of a window channel in one of the systems.

The window frame 10, forming part of the vehicle door, incorporates a window guide channel 11, one form of which is shown in FIG. 2. The window channel comprises extruded plastics or rubber material 12 of channel-shape which incorporates an embedded metal core or carrier 14.

The carrier 14 may take any suitable form. For example, it may comprise a simple channel of metal. The channel could additionally be formed with apertures to increase its flexibility. Instead, the carrier could be made from U-shaped metal elements arranged side-by-side to define the channel and either connected together by short flexible interconnecting links or entirely disconnected from each other. The metal could be steel or aluminium, for example.

Instead, the carrier could be made of metal wire looped to and fro to define the channel.

The carrier is advantageously incorporated into the extruded material 12 by a known cross-head extrusion process.

The extruded material defines a lip 16 projecting upwardly from the base of the channel, a large lip 18 directed inwardly into the channel from one edge of the channel's mouth, and a similar lip 20 on the opposite side of the channel but of shorter extent.

The window frame 10 (FIG. 1) may take the form of a metal channel which is sized to receive the guide channel 11 of FIG. 2. When the channel 11 is fitted into position within this frame, lips 22 and 24 (FIG. 2) overlap and grip the outsides of the frame.

The window channel 11 extends around the sides and top of the frame 10. Thus, it extends up that part 10A of the frame alongside the "A" pillar of the vehicle, along the top 10C of the frame and down that part 10B of the frame corresponding to the "B" pillar. Where the window glass 8 slides into and out of the lower part 5A of the door 5, a waist-seal (not shown) is provided on each side of the slot.

The surfaces of the window channel 11, and of the waist-seal, which contact the sliding glass are advantageously covered in flock or other suitable material to provide a low-friction and substantially weather-proof surface.

In the usual way, when the driver or a passenger wishes to raise or lower the window, he or she achieves this by operating an appropriate switch which energises the motor, and the window glass thus slides upwardly or downwardly within the window guide channel 11.

The system now to be described is for automatically stopping upward movement of the window glass 8 if the driver or passenger, or someone outside the vehicle, should inadvertently place a hand or other body part within the gap between the upper edge of the window glass 8 and the top of the window frame 10C. In a manner to be explained, if such a hand or body part comes within a predetermined distance of the top part 10C of the window frame (such as it might do if it were carried upwardly by the power-driven window glass), the system automatically stops the motor, by disconnecting its energization, before the hand or other body part becomes injured by being trapped between the top edge of the glass and the window frame 10C.

Figure 3:
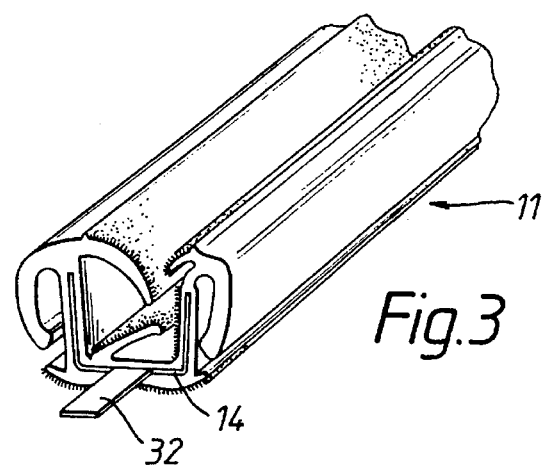
FIG. 3 is a view corresponding to FIG. 2 but showing an electrical contact connected to the window channel of FIG. 2.
Figure 4:
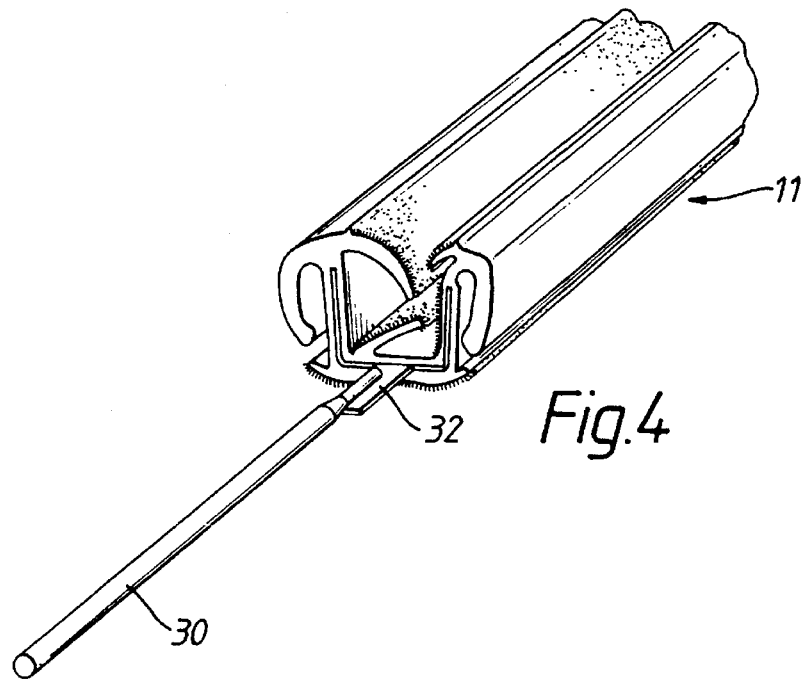
FIG. 4 corresponds to FIG. 3 but shows a further electrical connection.
Figure 5:
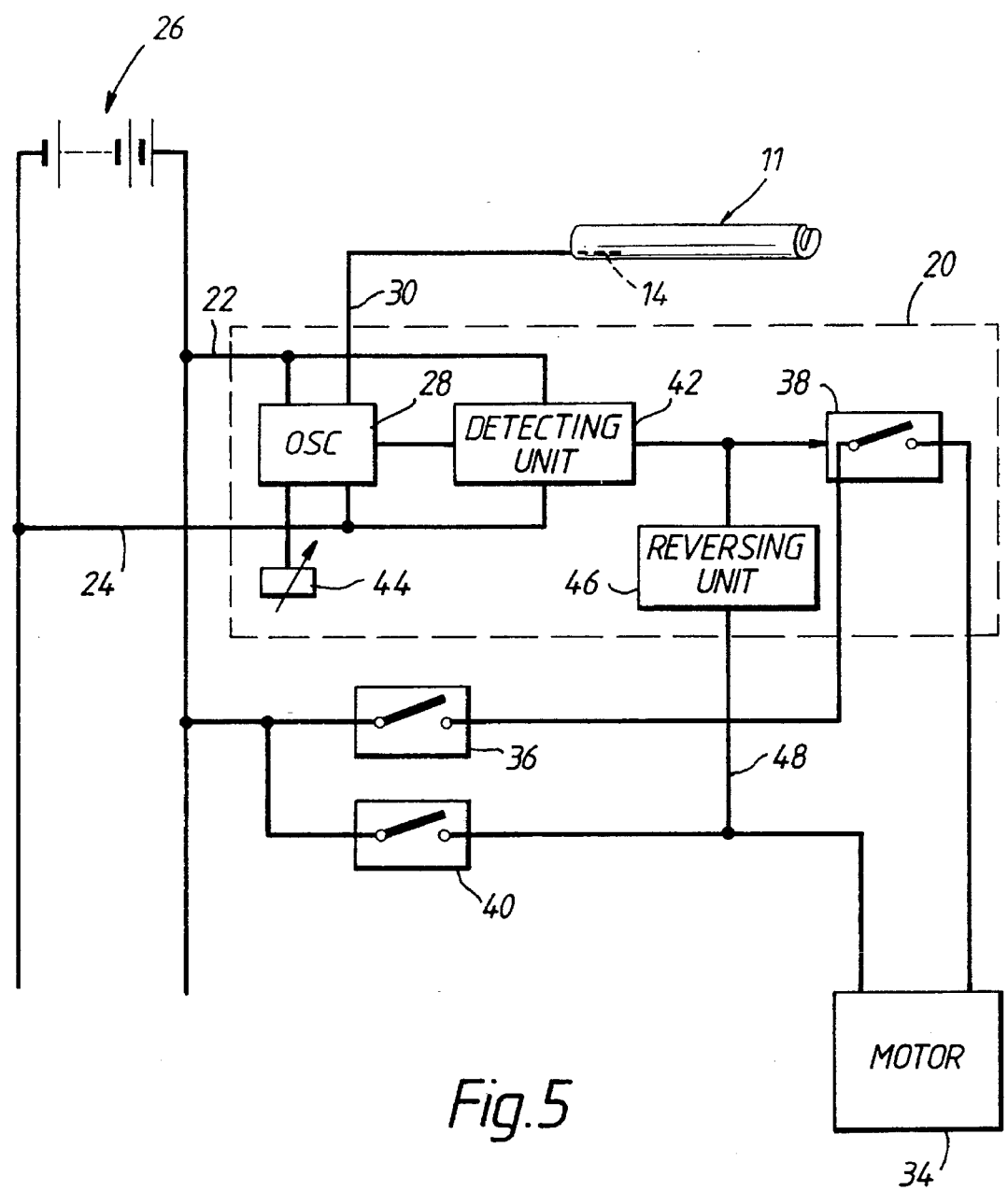
FIG. 5 is a block circuit diagram of one of the systems.

As shown in FIG. 5, the vehicle carries a control unit 20 which is supplied with electrical power on lines 22 and 24 from the vehicle's battery 26. The control unit 20 includes an oscillator 28 which produces a high frequency oscillating output on a line 30. Line 30 is connected to the metal carrier 14 within the window channel 11 (FIG. 2). The connection 30 may be made to the carrier 14 in any suitable way. FIG. 3 shows how the carrier 14 may be provided with a contact 32. FIG. 4 shows how the connection 30 is connected to the contact 32.

Advantageously, the metal carrier within the window guide channel 11 where it runs along the top part 10C of the window frame (FIG. 1) is separated from the carrier 14 in those parts of the window guide channel 11 fitted to the parts 10A and 10B of the window frame.

It will be understood that the extruded plastics or rubber material 12 electrically insulates the carrier 14 from the vehicle bodywork, and the contact 32 and the conductor 30 (FIGS. 3 and 4) are similarly insulated from the vehicle bodywork.

FIG. 5 also shows the circuit for energising the electric motor 34 for raising and lowering the window glass 8. The motor 34 is energized by means of a "up" switch 36 which is positioned for use by the driver or passenger. When the switch 34 is closed, the motor 34 is electrically energized through a further switch 38 forming part of the control unit 20. Switch 38 is normally closed. Closure of switch 36 therefore energized the motor 34, and the window glass thus begins to move upwards.

Switch 36 may be a solenoid-operated switch or a solid state switch.

A second switch 40 is provided for the driver or passenger, and is used for causing the motor 34 to lower the window glass. The output of switch 40 is connected directly to the motor 34 and not via the normally-closed switch 38.

When the system is energised in the manner described, an electric field is radiated by the carrier 14 and is present within the area of the window frame. If a human hand or other body part becomes present within this radiated field, the effect will be to cause a capacitive change to be sensed by conductor 30 because of the change in dielectric constant which results from the presence of the hand or other body part. This change in capacitance will be imposed on the circuitry of the oscillator 28 and will result in a significant change in its output—in the frequency and/or amplitude and/or phase of its output.

Figure 10:
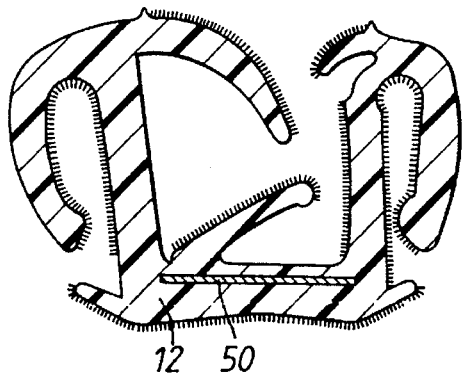

This change is detected by a detector circuit 42 (FIG. 10) which responds by opening the switch 38.

Therefore, when at least a predetermined amount of change in the output of the oscillator 28 occurs, switch 38 opens—that is, becomes open-circuit. The electrical supply to motor 34 is thus interrupted and the motor stops. Upward movement of the glass ceases and injury to the hand or other body part is prevented.

The oscillator 28 may be provided with an adjusting device 44 which adjusts the output power of the oscillator 28. This effectively adjusts the range over which the system can detect the present of a human hand or other body part within the window frame. The control 44 needs to be set so that the system will ensure that the rising window will be halted before injury occurs. The system can be set so that the rising window is stopped before the hand or other body part actually makes contact with the top 10C of the window frame. Instead, it can be set so that the window stops when the hand or other body part is in actual contact with the top 10C but before the rising window applies more than a predetermined and non-injurious force to the hand or other body part (e.g. 100N).

FIG. 5 shows how the control unit 20 may incorporate a reversing unit 46 which responds to the detected output from detector 42 by providing an output on a line 48 which reverses the motor 34, so as to cause it to lower the window.

The rising window glass on its own (that is, when no human hand or other body part is present in the gap between the glass and the top 10C of the window frame) does not itself significantly affect the output of the oscillator 28. This is because the dielectric constant of the window glass is many times less than that of a human hand or other body part.

The system can be adapted for frameless windows. In this case, there is no separate window frame. The rising and lowering window glass slides with respect to a seal or channel carried by the frame on the vehicle body within which the door is located. This channel or seal (such as a door seal) will normally also incorporate a metal carrier which can thus be connected to receive the output of the oscillator 28 in the manner already explained. If it does not incorporate such a metal carrier, a suitable electrical conducting strip may be mounted adjacent to it and suitably insulated from the vehicle body.

FIGS. 6 to 10 show other forms of window channel 11. In these forms, in some of which no separate metal carrier is provided, one or more electrical conductors 50 may be embedded within the extruded plastics or rubber material 12 as indicated. Again, such conductors 50 are electrically insulated by the extruded plastics or rubber material 12 from the vehicle bodywork. It will be understood that the actual configuration of the extruded plastics or rubber material of the window channels illustrated will vary according to the particular application.

Figure 11:
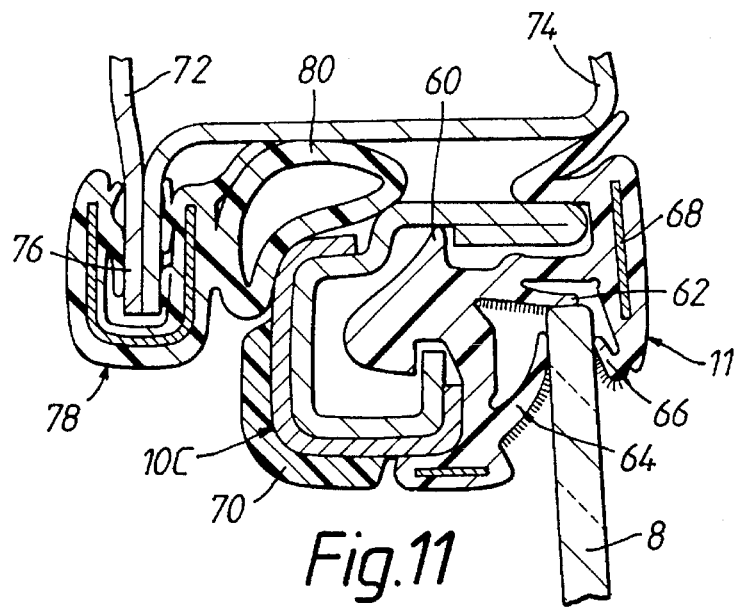
FIGS. 11 to 14 are more detailed cross-sections showing further possible window channels which can be used in the systems.

FIG. 11 shows a cross-section through the top 10C of the window frame, showing, also, the window channel 11 mounted in position. The window channel 11 shown in FIG. 11 differs somewhat in configuration from that shown in the previous Figures. In FIG. 11, the window channel 11 is made from plastics or rubber material and has a portion 60 which is clipped into the window frame 10C and holds the window channel in position. In addition, it has lips 62,64 and 66 which contact the rising window glass 8 and advantageously have flocked surfaces. As shown in FIG. 11, the window channel is provided with a metallic strip 68 and also with a metal band 70, both of which are embedded within the plastics or rubber material. One or both of these metal pieces is connected to receive the output from the oscillator 28 (FIG. 5).

FIG. 11 also shows part of the trim 70 on the inside of the window frame, together with parts of the body panels 72 and 74 where they meet at tile frame surrounding the door opening so as to define a flange 76. A door seal 78 incorporates a channel-shaped gripping part which embracingly grips the flange 76 and supports a door seal 80 which is sealingly contacted by the frame 10C when the door closes.

Figure 12:
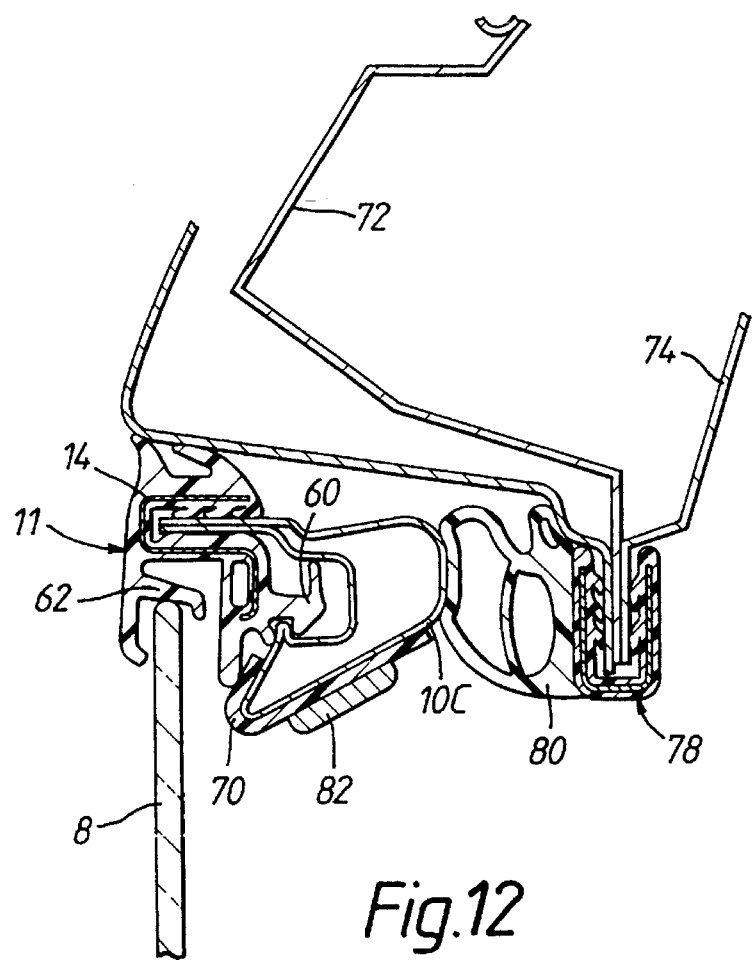

FIG. 12 shows a modified form of the arrangement shown in FIG. 11 and corresponding parts are similarly referenced. In this case, the window frame 11 incorporates a U-shaped carrier 14 for helping to hold the window channel on the window frame 10C. In this case, though, the metal carrier 14 is not connected to receive the output of the oscillator 28. Instead, the output of the oscillator 28 is connected to a moulding strip 82 which is mounted on the inside surface of the window frame 10C and is arranged to be electrically conductive. The strip 82 may, for example, be a metallic strip or it may be another electrical conductor incorporated within a suitable covering material. Conductive rubber could be used. It is electrically insulated from the window frame 10C by the trim material 70.

Figure 13:
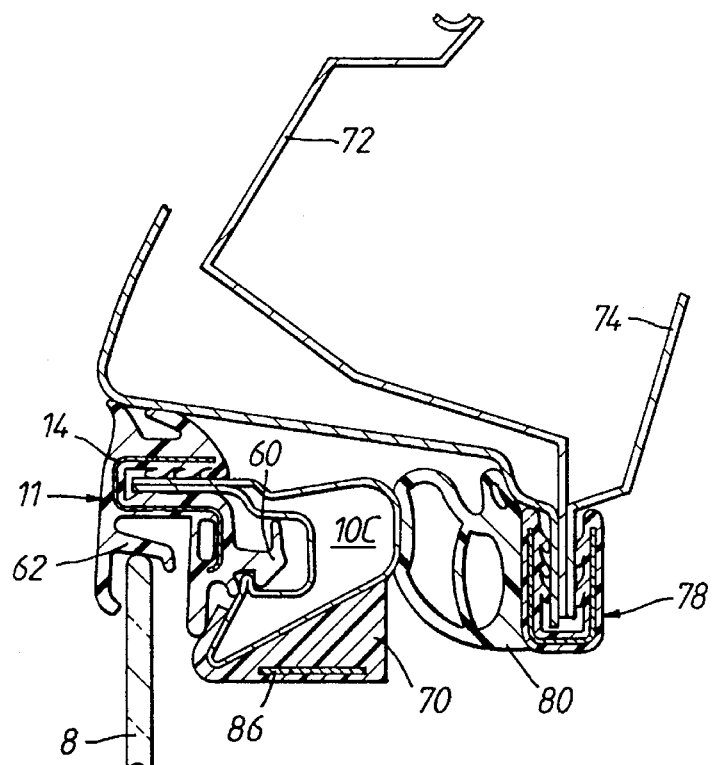

FIG. 13 shows a modification to the arrangement of FIG. 12, in which the trim panel 70 is differently shaped and incorporates a metallic core 86 which is connected to receive the output of the oscillator 28.

Figure 14:
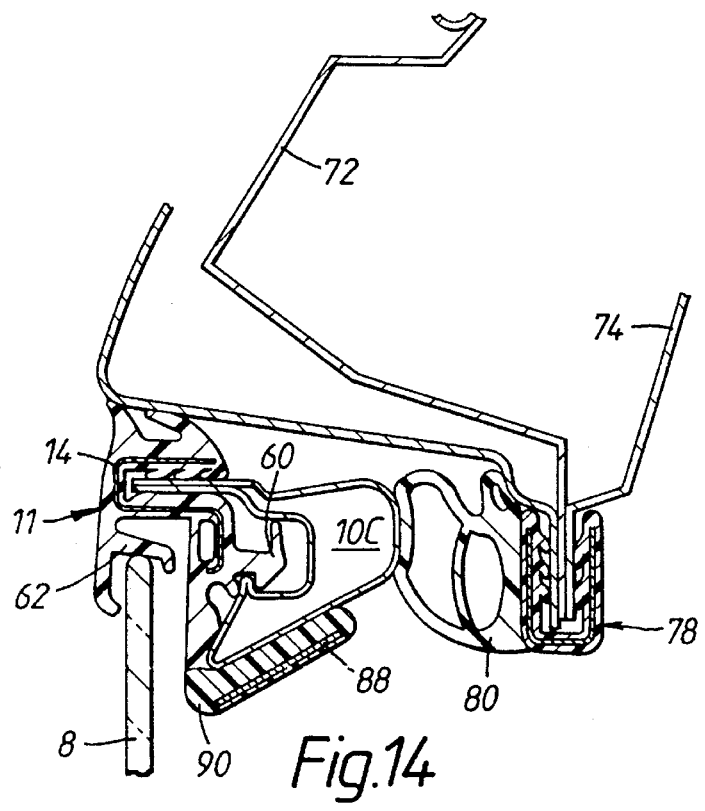

FIG. 14 shows a further modification in which a metallic core 88 is fed with the output of the oscillator 28 and is mounted on the window frame 10C within electrically insulating material 90.

In the arrangements of FIGS. 10 to 14, the operation is as previously described. Thus, the system can be set so that the rising window is stopped before the hand or other body part actually makes contact with the conductive element 82 connected to the output of the oscillator 28, or with the insulation material covering such element; instead, however, it can be set to stop the window when the hand or body part actually makes contact with such element or insulation (but before the window applies an injurious force).

In all the cases described above, the output of the oscillator 28 is fed to electrically conductive means mounted in or adjacent to a window guide channel or strip or seal adjacent the periphery of the window frame. Instead, the output of oscillator 28 could be connected to an electrical conductor running along at least part of the top edge 8A (FIG. 1) of the window glass 8. For example, a metallic layer could be suitably deposited on the top edge 8A or an electrical wire could be embedded in the edge. In certain cases, vehicles incorporate double-glazed window panels, comprising two glass panes mounted immediately adjacent to, though separated from, each other. A metallic conductor could be incorporated within such panes, such as running along between them adjacent the top edge. The system operates in the manner generally described with reference to FIG. 5. Thus, the presence of a human hand or other part of the human body on or immediately adjacent to the top edge 8A of the window glass will affect the electrical field radiated by the electrical conductor incorporated in or on the glass at that edge, resulting in activation of the detecting unit 42 in the manner described.

In these cases, suitable means would have to be provided for making the electrical connection from the output of the oscillator 28 to the electrical conductor in or adjacent to the top edge 8A of the window glass. For example, the electrical conductor could be extended down the side edge of the window glass to a position within the lower part of the door where it could be arranged to slide in electrical contact with a fixed electrical conductor connected to the output of the oscillator 28 but electrically insulated from the vehicle's body. Other arrangements are, however, possible.

Figure 15:
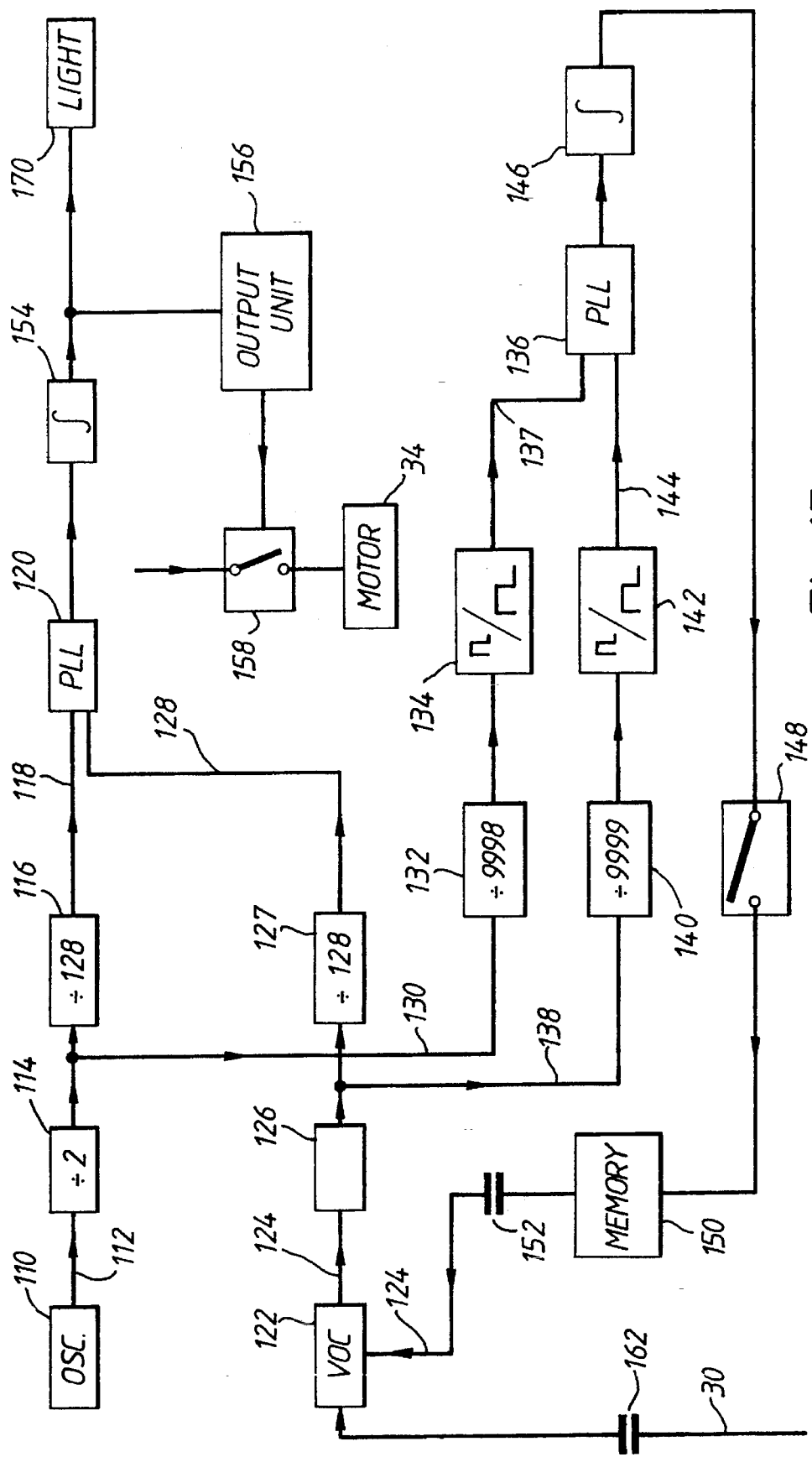
FIG. 15 s a detailed circuit diagram showing a circuit which can be used in another of the systems.

FIG. 15 shows in more detail a different form which the control unit 20 of FIG. 5 may take.

The circuit of FIG. 15 has a first oscillator 110 which is quartz-stabilised and has an output frequency of (in this example) 3.27 MHz. The oscillator's output on a line 112 is divided by two in a divider 114 and then divided by 128 in a divider 116 and passed on a line 118 to one input of a phase comparator in a phase-locked loop 120.

The circuit also includes a second oscillator 122, which is a voltage controlled oscillator (VCO) and whose frequency is adjustable by means of a control signal on a line 124 but is nominally at 1.6 MHz. The output frequency of the VCO 122 is fed on a line 124 through a shaping circuit 126 to a divider 127 having a division factor of 128. The output from the divider 127 is fed to the second input of the phase comparator in the phase-locked loop 120 by means of a line 128.

A line 130 feeds the output from divider 114 to a further divider 132 having a division factor of 9998 and thence to a circuit unit 134 which produces a square wave signal which is fed to one input of the phase comparator in a second phase-locked loop 136 by a line 137.

A line 138 connects the output from the circuit 126 to a divider 140 having a division factor of 9999. The output of this divider is fed through a circuit unit 142 which corresponds to circuit unit 134 and produces a square wave signal which is then fed on a line 144 to the second input of the phase comparator in the phase-locked loop 136.

The control output of the phase-locked loop 136, dependent on the phase and frequency error between the compared signals received on lines 137 and 144, is integrated in an integrator 146 and fed through a switch 148 to a memory 150. Thence it is fed via a capacitor 152 to the line 124 where it controls the frequency of VCO 122 in a manner to be described.

The output of phase-locked loop 120, dependent on the difference in phase and frequency of the signals received on lines 118 and 128 respectively, is fed through an integrator 154 to an output unit 156. Output unit 156 controls a switch 158 connected to the motor 34 which moves or slides the window glass between its closed and open positions.

Switch 148 is closed except when the window is moving in the closing direction (i.e. upwardly).

Line 30 (corresponding to the line 30 of FIG. 5) connects the VCO 122 to the metal carrier 14 or to the other conductors referred to in FIGS. 6–14, for example, conductors 50,68,70,82,86 and 88.

In use, and assuming that the window is closed, switch 148 will also be closed, and the phase-locked loop 136 will compare the phases and the frequencies of the square wave signals respectively received on lines 137 and 144 from the oscillators 110 and 122. With the window closed, the signal received by VCO 122 from line 30 will be dependent on ambient conditions adjacent to the window (for example, temperature, moisture caused by rain and the like and other atmospheric conditions) and will tend to alter the frequency of the VCO 122 accordingly. The output of the phase-locked loop 136 is fed through integrator 146 and closed switch 148 to produce a control signal on line 124 which offsets the effect of such ambient conditions on the VCO and adjusts the VCO to have a fixed frequency in relation to the stable oscillator 110. The effects of weather on the circuit are thus substantially eliminated. As soon as the window starts to close, though, switch 148 is opened as well and the phase-locked loop 136 no longer has any effect on the frequency of oscillator 122. The signal on line 124 now remains constant (being stored in memory 150). While the window glass is being driven to the closed position by a motor 34, the presence of a human hand or other human body part adjacent to the energised conductor 14 (FIGS. 2–4), or to the corresponding conductors in the other Figures, produces a change in the signal on line 30. This in turn will cause a change in the frequency of the VCO 122. This will be sensed by the phase comparator in the phase-locked loop unit 120. The resultant change in the control signal produced by the comparator will be integrated by integrator 154 and fed to the output unit 156. The output unit 156 will therefore respond by opening switch 158 so as to de-energize motor 34.

In addition, the output from integrator 154 can be arranged to energize a warning light 170.

Figure 16:
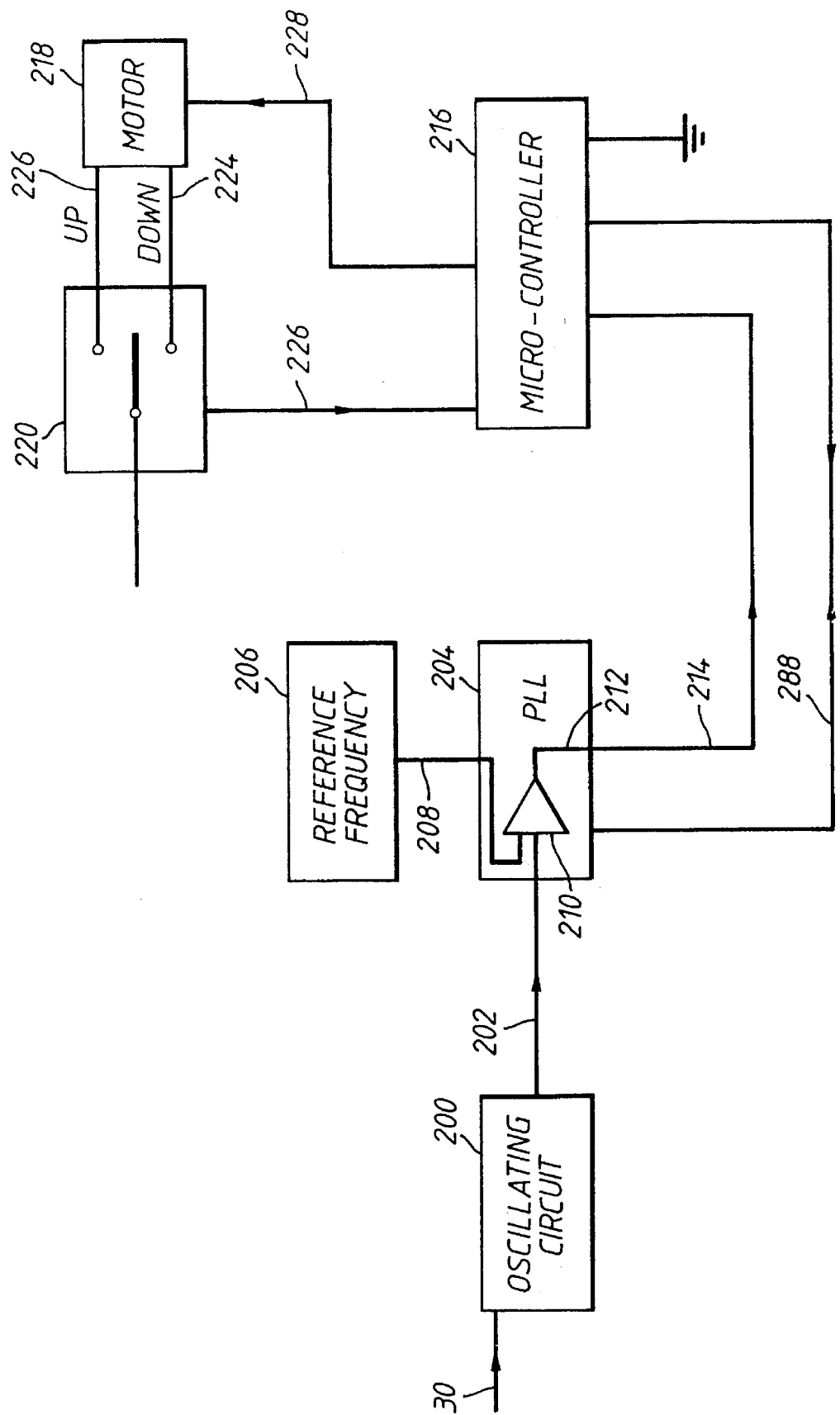
FIG. 16 is a block circuit diagram of another form of circuit which can be used in the system.

FIG. 16 is a block diagram of another form which the circuit of the control unit 20 of FIG. 5 may take.

Figure 6:
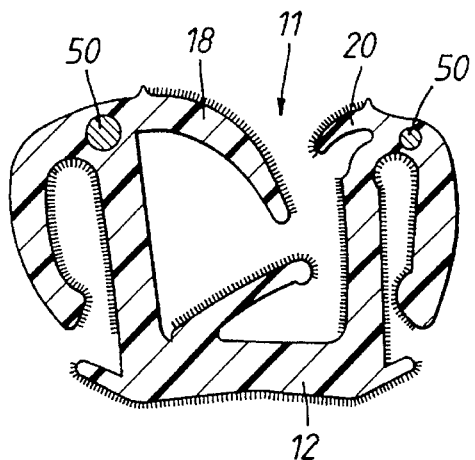
FIGS. 6 to 10 are cross-sections showing other possible forms of window channel which can be used in the systems.
Figure 7:
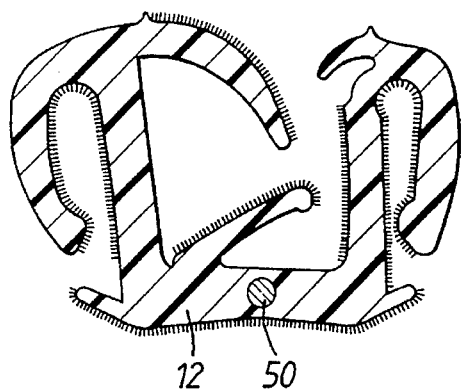
Figure 8:
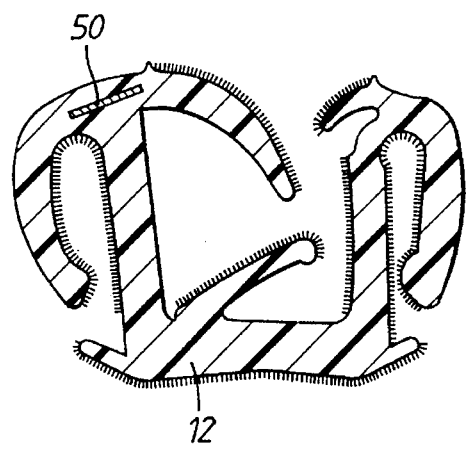
Figure 9:
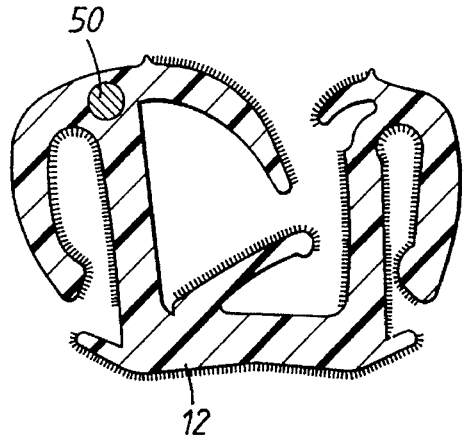

The circuit of FIG. 16 has a voltage controlled oscillator (VCO) 200 which is connected by a line 30 to the metal carrier 14 or to the other conductor referred to in FIGS. 6–4, for example conductors 50,68,70,82,86 and 88. Line 30 therefore effectively connects a capacitor to the VCO 200, the capacitor being formed by the conductor 50,68,70,82,86 or 88, the capacitance of this capacitor being affected by the presence of part of the human body and being connected to the VCO 200 to cause the frequency of the VCO 200 to vary in the manner already described.

The output frequency $F_o$ of the VCO 200 is fed on a line 202 to a phase-locked loop 204 which also receives the output frequency $F_r$ of a reference oscillator 206 on a line 208. The phase-locked loop 204 incorporates a phase comparator shown diagrammatically at 210 which compares the phases of the outputs of the VCO 200 and the reference oscillator 206 so as to produce an output voltage on a line 212 which is dependent on the phase difference and thus on the difference in frequency between $F_o$ and $F_r$. The other elements of the phase-locked loop are not shown.

This output voltage $V_c$ is fed on a line 214 to a microprocessor 216.

FIG. 16 also illustrates the motor 218 which is energised under the control of the driver or a passenger in the vehicle to raise or lower the window glass. The control switch is shown at 220. The switch has an OFF or central setting in which neither of its two output lines 222 and 224 is energized when the switch is ON and energizing line 222, the motor 218 drives the window glass UP. When the switch is ON and energizing line 224, the motor is energized to drive the window glass DOWN. By means of a line 226, the microprocessor 216 detects the setting of the switch 220: that is, whether it is ON or OFF and, if it is ON, whether it is causing the window glass to be driven UP or DOWN. By means of an output line 228, and in a manner to be described, the microprocessor 216 can stop the motor 218 and then energized it to drive the window glass DOWN.

The operation of the circuit of FIG. 16 will now be explained, with reference to the flow chart of FIG. 17.

The microprocessor 216 repeatedly cycles through a sequence of operations.

Firstly (Stage 230, FIG. 17), it determines the state of switch 220 by means of line 226 (FIG. 16). If it determines that switch 20 is OFF (Stage 232), this indicates, of course, that the window glass is stationary (Stage 234).

If it determines (Stage 236) that the switch 220 is ON, the microprocessor then checks (Stage 238) whether the switch is set to drive the window UP (Stage 240) or not (Stage 242). In the latter case, of course, this means that the window glass is moving DOWN <Stage 244).

The operation of the circuit when the window glass is at a standstill (Stage 234) or is moving down (Stage 244) is the same, and will now be considered.

Figure 17:
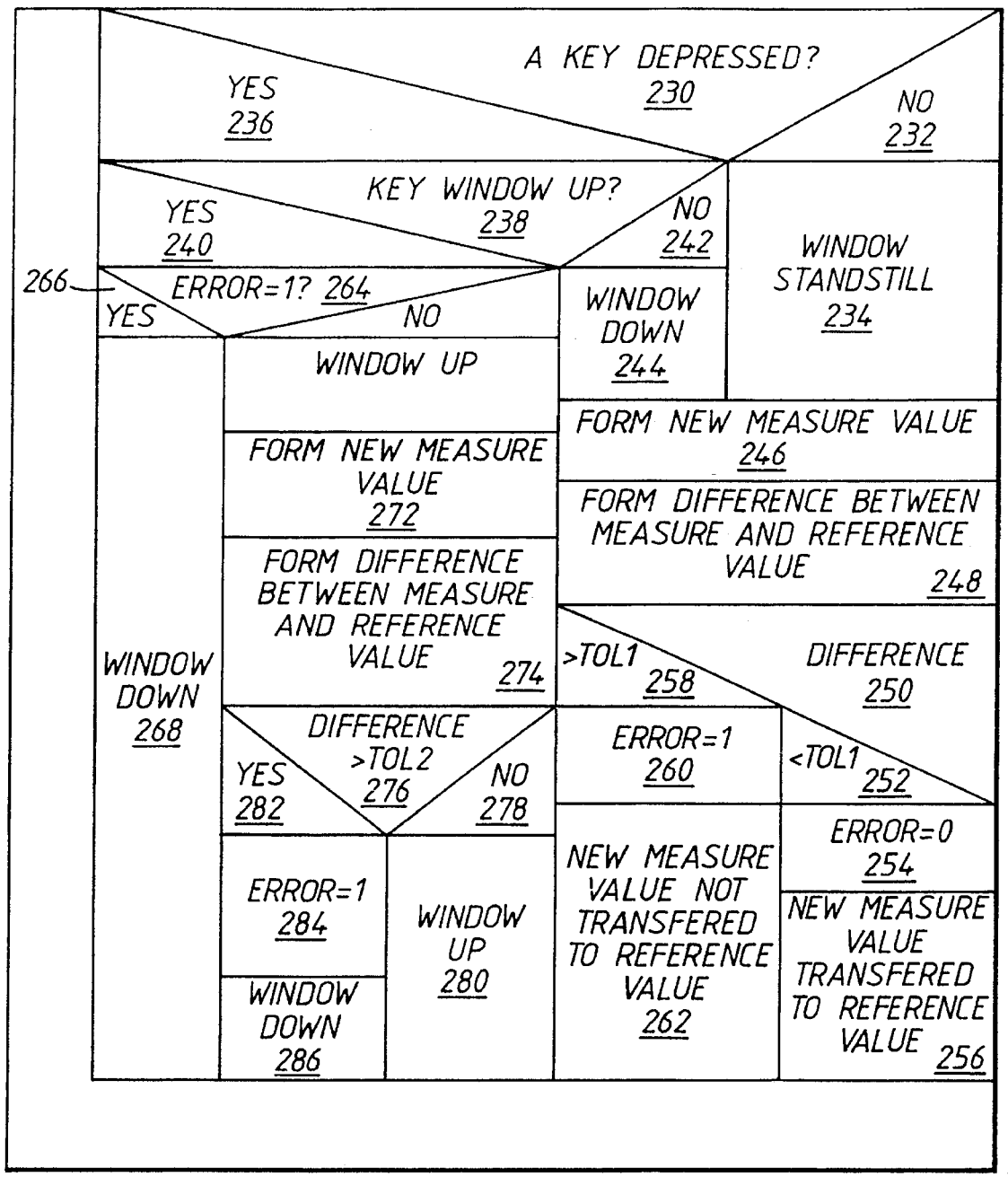
FIG. 17 is a flow chart for explaining the operation of the circuit of FIG. 16.

The microprocessor 216 now measures the value of the control voltage V received on line 214 (FIG. 16)–Stage 246, FIG. 17. It then compares this measured value of $V_c$ with a previously stored reference value ($V_r$—see Stage 248). The value of the resultant difference is then assessed (Stage 250) by the microprocessor 216 against a tolerance value, "Tol 1". This measured difference will be dependent, of course, on changes in the frequency $F_o$ of the VCO 200. Such frequency variations will depend on various factors. As already explained, the VCO frequency $F_o$ will be affected by ambient conditions adjacent to the window, in particular temperature and similar effects. In addition, of course, the VCO frequency $F_o$ will be affected by the presence of a human hand or other human body part adjacent to the window opening.

If the measured difference (Stage 250) is less than Tol 1 (Stage 252), thus indicating a relatively small change in the VCO frequency $F_o$, this is interpreted as a change caused by variation in temperature or other ambient effect. A measured difference of less than Tol 1 is considered to have an "error value" of zero (Stage 254). In response to detection of a zero error value, the microprocessor stores the new measured value of the control voltage on line 214 to form a new reference value $V_r$ (Stage 256).

If, however, the measured difference (Stage 250) between the actual value $V_c$ of the control voltage and the stored reference value $V_r$ is greater than Tol 1 (Stage 258), the "error value" is assessed at "1" (Stage 260). The system interprets this as indicating that a hand or other human body part is present in or near the window opening. The new measured value of $V_c$ is therefore not transferred to become the new reference value $V_r$ (Stage 262). No other action is taken in response to this detection of part of the human body in the window opening—because, of course, the window glass is either moving down or is stationary.

In this way, for so long as the window glass is stationary or moving down, the microprocessor 216 repeatedly assesses the value of the control voltage $V_c$ and compares it with the previously stored value $V_r$. Adjustments in $V_r$ are made to take account of temperature and similar environmental effects. The stored value $V_r$ thus continuously represents the frequency of the VCO 200.

If (Stage 240) the microprocessor detects that the switch 220 is causing the window to be driven UP, the microprocessor immediately assesses whether the difference between the measured value $V_c$ of the control voltage differs from the currently stored reference value $V_r$ sufficiently to produce a value "1" (Stage 264) for the error value. If the error value is 1 (Stage 266), this indicates that a sufficient change in the frequency $F_o$ of the VCO 200 has occurred to indicate the presence of a human body part in the window opening. The microprocessor therefore energises line 228 (FIG. 16) to cause the motor 218 to stop and then drive the window glass DOWN (Stage 268).

However, if (Stage 270) the assessed error value is not "1", the window continues to be driven UP by the motor 218 (Stage 271). The microprocessor then measures the value of $V_c$ again (Stage 272) and assesses the difference (Stage 274) between this new measured value and the stored value of $V_r$. The system then assesses whether this difference is greater or less than a tolerance value "Tol 2" (Stage 276). Tol 2 is set as a threshold value such that an assessed difference greater than Tol 2 indicates the presence of a human body part in the window opening. If the assessed difference is less than Tol 2 (Stage 278), the window continues to be driven UP (Stage 280). However, if the assessed difference is greater than Tol 2 (Stage 282), this is interpreted as an "error value" of "1" (Stage 284) and the microprocessor therefore energises line 228 (FIG. 16) to stop the motor 218 and to cause it to drive the window DOWN.

Because the system continuously adjusts the reference value $V_r$ to take account of temperature and similar ambient parameters, these parameters are substantially offset and do not affect the detection of the presence of part of the human body in the window opening.

The microprocessor 216 may be connected to the phase locked loop 214 by other data transfer lines indicated generally at 288 for control and operational purposes.

In a further modification, the micro-processor 216 may be connected directly to the line 30. The micro-processor clock circuit charges and discharges the capacitor constituted by the conductor 50,68,70,82,86 or 88 to which the line 30 is connected. The micro-processor detects the voltage across this capacitor and monitors its variations to detect changes in capacitance. Such changes, which may be due to temperature and other ambient effects, or to the presence of part of the human body in or near the window opening, may then be processed in the manner already described.

Figure 18:
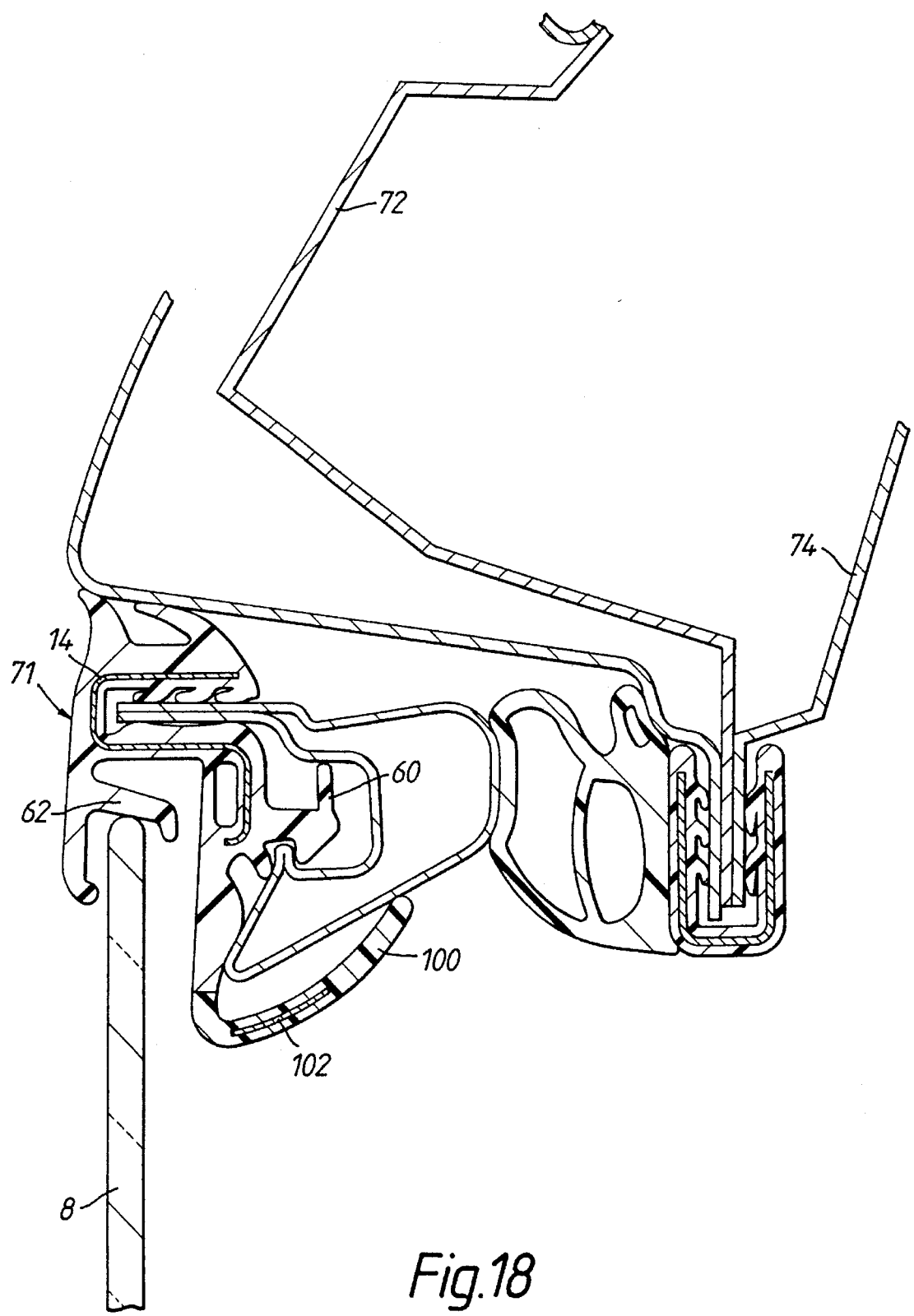
FIG. 18 is a cross-section showing another form of window channel which can be used in another of the systems.

FIG. 18 is a cross-section through another form of window channel which is used in a modified form of the system. Parts in FIG. 18 corresponding to those in other Figures are similarly referenced.

In the system of FIG. 18, the extruded material defining one side of the window channel is extended to form a flexible lip 100 incorporating a metal carrier or conductor 102. This may be in the form of a metal strip, possibly apertured or slotted to increase its flexibility. Instead, however, a metal wire could be used.

In the system of FIG. 18, the conductor 102 constitutes one plate of a capacitor forming part of the tuned circuit of the oscillator 28, and an appropriate connection to the conductor 102 is made from the oscillator tuned circuit accordingly. The lip 100 is so positioned in relation to the window glass 8 that a human hand or other human body part on the rising edge of the window glass 8 will make contact with the lip 100 as the window glass rises to the closed position, and will alter the position of the lip 100 because of the latter's flexibility. The consequent movement of the metal conductor 102 will cause a significant change in the capacitance in the tuned circuit of the oscillator 28. An abrupt and significant change in the oscillator frequency will therefore take place and this will be detected by the detecting unit 42 (FIG. 5) and thus immediately stop the rising window glass. In the normal position of the lip 100 (that is, when not contacted by any external object such as a human hand or other body part), the capacitance in the tuned circuit of the oscillator 28 is such that its output frequency does not activate the detecting unit 42, and the motor 34 for driving the window glass can thus operate normally.

The system of FIG. 18 is advantageous in that the change in the oscillator output frequency, in response to the human hand or other body part, can be more substantial and easier to detect than is the case with the systems described with reference to the previous Figures. The system of FIG. 18 may therefore be less sensitive to extraneous effects and easier to adjust. In addition, the circuit can be simpler.

The systems are advantageous in that they require only a single electrical connection and require little or no modification to the window arrangement. Existing vehicles can be easily modified. There are no wearing parts. Most forms of existing window guide channels can be adapted for use in the system. The system is robust and needs no extra space and can be inexpensive, The other power-driven windows of the vehicle may be controlled in the same way.

The systems described may of course be used to control horizontally slidable power-driven windows instead. They may also be used to control angularly movable power-driven windows.

What is claimed is:

1. A system for controlling a power-driven window glass slidably movable between closed and opened positions in a window opening defined in a motor vehicle by an electrically conductive window frame, comprising:

a sealing or guiding strip attachable to the window frame for sealing or guiding the window glass as it moves between the opened and closed positions, the sealing or guiding strip being made of plastics or rubber material and incorporating only a single electrode electrically insulatingly embedded within the plastics or rubber material, electrical circuit means for producing an electrical output, connecting means connecting the single electrode to the electrical circuit means such that the presence of a part of the human body at or not more than a predetermined distance from the single electrode produces a change in the electrical output, detecting means responsive to the change in the electrical output to produce an output signal, and output means responsive to the output signal for interrupting sliding movement of the window glass in the window opening, the electrical circuit means producing the electrical output as an electrically oscillating output.

2. A system according to claim 1, in which the single electrode is energized by the electrical circuit means to radiate a field within the window opening which is affected by the presence of the said part of the human body at or not more than the predetermined distance from the single electrode to produce the change in the oscillating output.

3. A system according to claim 2, including means for adjusting the field so as to vary the said predetermined distance.

4. A system according to claim 1, in which the electrical circuit means comprises a controllable-frequency electrical oscillator whose frequency is dependent on the value of a control signal applied to a control input of the oscillator, and the connecting means comprises means connecting the single electrode to affect the control input.

5. A system according to claim 4, in which the electrical circuit means incorporates adjusting means for offsetting the effect on the controllable-frequency oscillator of conditions adjacent to the single electrode other than caused by the presence of said part of the human body.

6. A system according to claim 5, including reference means producing a stable reference frequency, and in which the adjusting means comprises comparing means operative when the window glass is not moving towards the closed position to compare the frequency of the controllable-frequency oscillator with the stable reference frequency whereby to produce a comparison signal dependent on the difference between the compared frequencies.

7. A system according to claim 6, including means responsive to the value of the comparison signal to compare it with a previously stored reference value to assess whether the difference between the comparison signal and the reference value is greater or less than a predetermined tolerance level, and operative to store the value of the comparison signal as the new value for the reference value only if the said difference is less than the predetermined tolerance level, the detecting means being operative to produce the said output signal when the difference between the comparison signal and the reference value indicates the said presence of part of the human body.

8. A system according to claim 5, in which the adjusting means comprises means operable to adjust the frequency of the controllable-frequency oscillator to a predetermined value when the window glass is not moving towards the closed position.

9. A system according to claim 6, including means for applying the comparison signal to the said control input of the controllable-frequency oscillator.

10. A system according to claim 6, in which the reference means is a stable-frequency oscillator in a phase-locked loop, and in which the comparing means comprises a comparator within the phase-locked loop.

11. A system according to claim 4, in which the detecting means comprises comparing means operative when the window glass is moving towards the closed position for comparing the frequency of the controllable-frequency oscillator with a predetermined frequency.

12. A system according to claim 6, in which the detecting means comprises further comparing means operative when the window glass is moving towards the closed position for comparing the frequency of the controllable-frequency oscillator with the said stable reference frequency.

13. A system according to claim 12, in which the said further comparing means comprises part of a phase-locked loop.

14. A system according to claim 1, in which the electrical circuit means comprises an electrical oscillator producing the oscillating output, the oscillator having a tuned circuit in which is connected the single electdrode, and the single electrode is movably mounted on the sealing or guiding strip so as to be moved by direct or indirect contact with said part of the human body to produce a change in frequency of the oscillating output.

15. A system according to claim 1, in which the sealing or guiding strip is attached to the frame.

16. A system according to claim 1, in which the window is slidably mounted within a door of the motor vehicle, the vehicle having a door frame which defines an opening closable by the door, the door frame defining at least part of said frame for the window opening, and in which the sealing or guiding strip is mounted on or adjacent to said at least part of the door frame.

17. A system according to claim 1, in which the window glass is a double-glazed window glass.

18. A system according to claim 1, in which the window glass is driven by an electric motor and the output means comprises a switch for interrupting energization of the motor.

19. A system according no claim 1 (16), in which the single electrode electrical conductor is a reinforcing metal carrier.

20. A system according to claim 1, in which the output means includes means responsive to the control signal for causing the window glass to reverse its sliding direction.

21. A system for controlling a power-driven window glass slidable in a window opening defined by a window frame in a motor vehicle, the window glass being slidable between open and closed positions, comprising a sealing or guiding strip comprising flexible electrically insulating plastics or rubber material which supports only a single, embedded, electrode the sealing or guiding strip being adapted to be secured to the frame in use for sealing or guiding the slidable window glass, the single electrode being positioned adjacent to the window opening by the sealing or guiding strip so as to be physically moved by direct or indirect contact with part of the human body positioned between the sliding window glass and the frame during power-driven closure of the window glass, electrical circuit means connected to the single electrode so as to respond to the movement of the single electrode and to produce a corresponding output, detecting means responsive to the output to produce a control signal, and control means responsive to the control signal for interrupting power-driven movement of the window glass, the electrical circuit means incorporating an electrical oscillator, and the single electrode being connected to a tuned circuit of the oscillator whereby said movement of the single electrode changes the frequency of the oscillator to produce said output.

22. A system according to claim 21, in which the single electrode is a reinforcing metal carrier.

23. A system according to claim 21, in which the power-driven window glass is driven by an electric motor and the control means comprises a switch for interrupting energization of the motor.

24. A system according to claim 21, in which the control means includes means responsive to the control signal for causing the window glass to reverse its sliding direction.

25. A system for controlling a power-driven window glass slidable between closed and open positions in a window opening which is defined by a window frame in a motor vehicle, comprising:

a sealing and guiding strip made of flexible plastics or rubber material and adapted for mounting on the window frame for sealing and guiding the sliding window glass, the sealing and guiding strip incorporating only a single longitudinally extending electrically conductive metal reinforcement which is electrically insulated from the frame by the flexible plastics or rubber material, electrical circuit means comprising a controllable-frequency electrical oscillator whose frequency is dependent on the value of a control signal applied to a control input of the oscillator, connecting means connecting the metal reinforcement to the control input of the electrical oscillator such that the presence of a part of the human body in the window opening at or not more than a predetermined distance from the metal reinforcement produces a change in the frequency of the oscillator, detecting means responsive to the change in the frequency of the oscillator to produce an output signal, and output means responsive to the output signal for interrupting movement of the window glass in the window opening, the electrical circuit means also including a stable-frequency oscillator connected in a phase-locked loop, a comparator in the phase-locked loop to compare the frequency of the controllable-frequency oscillator with the stable-frequency oscillator and to produce a comparison signal dependent on the difference between the compared frequencies, means responsive to the value of the comparison signal to compare it with a previously stored reference value to assess whether the difference between the comparison signal and the reference value is greater or less than a predetermined tolerance level and operative to store the value of the comparison signal as the new value for the reference value only if the said difference is less than the predetermined tolerance level, the detecting means being operative to produce the said output signal when the difference between the comparison signal and the stored reference value indicates the presence of part of the human body, the currently stored reference value offsetting the effect on the controllable-frequency oscillator of conditions adjacent to the metal reinforcement other than caused by the presence of said part of the human body.

* * * * *